(12) United States Patent
Kim (10) Patent No.: US 9,812,518 B2
(45) Date of Patent: Nov. 7, 2017

(54) THIN FILM TRANSISTOR ARRAY SUBSTRATE AND ORGANIC LIGHT-EMITTING DISPLAY APPARATUS INCLUDING THE SAME

(71) Applicant: Samsung Display Co., Ltd., Yongin-si, Gyeonggi-Do (KR)

(72) Inventor: Hyunchul Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 54 days.

(21) Appl. No.: 14/945,177

(22) Filed: Nov. 18, 2015

(65) Prior Publication Data

US 2016/0300898 A1 Oct. 13, 2016

(30) Foreign Application Priority Data

Apr. 7, 2015 (KR) .................. 10-2015-0049078

(51) Int. Cl.
*H01L 27/32* (2006.01)
*H01L 29/786* (2006.01)
*H01L 23/522* (2006.01)
*H01L 27/12* (2006.01)

(52) U.S. Cl.
CPC ...... *H01L 27/3262* (2013.01); *H01L 23/5226* (2013.01); *H01L 29/78675* (2013.01); *H01L 27/124* (2013.01); *H01L 27/1248* (2013.01); *H01L 27/1255* (2013.01); *H01L 27/3223* (2013.01)

(58) Field of Classification Search
CPC ............ H01L 27/1248; H01L 27/3262; H01L 27/1229; H01L 29/78675; H01L 29/78696; H01L 27/1255; H01L 27/127; H01L 27/1274
See application file for complete search history.

(56) References Cited

U.S. PATENT DOCUMENTS

| 5,763,936 | A | 6/1998 | Yamaha et al. |
| 6,274,886 | B1 | 8/2001 | Sasaki et al. |
| 8,269,217 | B2 | 9/2012 | Arai et al. |
| 8,754,414 | B2 | 6/2014 | Moon et al. |
| 2008/0129187 | A1* | 6/2008 | Tamura .................. H01J 29/04 313/495 |

(Continued)

FOREIGN PATENT DOCUMENTS

| JP | 2010-183027 A | 8/2010 |
| JP | 2014-063174 A | 4/2014 |

(Continued)

*Primary Examiner* — Victoria K Hall
(74) *Attorney, Agent, or Firm* — H.C. Park & Associates, PLC (57) ABSTRACT

Provided is a thin film transistor array substrate. The thin film transistor array substrate includes a first sub-pixel region and a second sub-pixel region; a first thin film transistor and a second thin film transistor disposed in the first sub-pixel region and the second sub-pixel region on the substrate, respectively; and a first insulating layer including at least one first dummy hole formed above or adjacent to the first thin film transistor, and a plurality of second dummy holes formed in a greater number than the at least one first dummy hole, formed above or adjacent to the second thin film transistor.

20 Claims, 7 Drawing Sheets

(56) References Cited

U.S. PATENT DOCUMENTS

| | | | |
|---|---|---|---|
| 2010/0177126 A1 | 7/2010 | Inoue et al. | |
| 2013/0270562 A1* | 10/2013 | Yamazaki | H01L 29/786 257/57 |
| 2014/0034923 A1 | 2/2014 | Kim et al. | |

FOREIGN PATENT DOCUMENTS

| | | |
|---|---|---|
| KR | 10-2008-0037347 A | 4/2008 |
| KR | 10-2013-0015704 A | 2/2013 |
| KR | 10-2014-0018623 A | 2/2014 |
| WO | 2009-008234 A1 | 1/2009 |

* cited by examiner

THIN FILM TRANSISTOR ARRAY SUBSTRATE AND ORGANIC LIGHT-EMITTING DISPLAY APPARATUS INCLUDING THE SAME

CLAIM OF PRIORITY

This application claims the priority of and all the benefits accruing under 35 U.S.C. §119 of Korean Patent Application No. 10-2015-0049078, filed on Apr. 7, 2015, in the Korean Intellectual Property Office (KIPO), the disclosure of which is incorporated herein in its entirety by reference.

BACKGROUND OF THE INVENTION

1. Field of Disclosure

One or more exemplary embodiments relate to a thin film transistor array substrate and an organic light-emitting display apparatus including the same.

2. Description of the Related Art

A display apparatus such as an organic light-emitting display apparatus, a liquid crystal display apparatus, etc. includes a thin film transistor array substrate including a thin film transistor (TFT), a capacitor, and wirings. The TFT array substrate is formed of fine patterns such as a TFT, a capacitor, a wiring, etc., and the display apparatus is operated by complex connections between the TFT, the capacitor, and the wirings.

Meanwhile, since an organic light-emitting display apparatus, which is a self-luminous display apparatus, does not require a separate light source, the organic light-emitting display apparatus may be driven using a low voltage and configured in a lightweight and slim shape and has excellent characteristics such as viewing angles, contrast, response speeds, etc., so that an application range thereof extends from a personal portable apparatus such as an MP3 player, or a mobile phone up to a television (TV).

Recently, as a demand for an organic light-emitting display apparatus having a compact size and high resolution increases, a demand for efficient spatial arrangement between a TFT, a capacitor, wirings included in the organic light-emitting display apparatus, a connection structure, a driving method, and quality improvement of a realized image has increased.

SUMMARY OF THE INVENTION

One or more exemplary embodiments include a thin film transistor array substrate and an organic light-emitting display apparatus having the same.

Additional aspects will be set forth in part in the description which follows and, in part, will be apparent from the description, or may be learned by practice of the presented embodiments.

A display apparatus such as an organic light-emitting display apparatus, a liquid crystal display apparatus, etc. includes a thin film transistor array substrate including a thin film transistor (TFT), a capacitor, and wirings. The TFT array substrate is formed of fine patterns such as a TFT, a capacitor, a wiring, etc., and the display apparatus is operated by complex connections between the TFT, the capacitor, and the wirings.

Meanwhile, since an organic light-emitting display apparatus, which is a self-luminous display apparatus, does not require a separate light source, the organic light-emitting display apparatus may be driven using a low voltage and configured in a lightweight and slim shape and has excellent characteristics such as viewing angles, contrast, response speeds, etc., so that an application range thereof extends from a personal portable apparatus such as an MP3 player, or a mobile phone up to a television (TV).

Recently, as a demand for an organic light-emitting display apparatus having a compact size and high resolution increases, a demand for efficient spatial arrangement between a TFT, a capacitor, wirings included in the organic light-emitting display apparatus, a connection structure, a driving method, and quality improvement of a realized image has increased.

According to one or more exemplary embodiments, a thin film transistor array substrate includes a substrate including a first sub-pixel region and a second sub-pixel region; a first thin film transistor and a second thin film transistor disposed in the first sub-pixel region and the second sub-pixel region on the substrate, respectively; and a first insulating layer including at least one first dummy hole (a through-hole formed without being coated or filled by a metal material) formed above or adjacent to the first thin film transistor, and a plurality of second dummy holes, which are formed in a greater number than the number of the at least one first dummy hole, formed above or adjacent to the second thin film transistor.

The thin film transistor array substrate may further include a second insulating layer, at least a portion of which is buried in the at least one first dummy hole and the plurality of second dummy holes, and which is formed of a material different from the first insulating layer.

The thin film transistor array substrate may further include a third sub-pixel region that is adjacent to the first sub-pixel region and/or the second sub-pixel region, and a third thin film transistor may be disposed in the third sub-pixel region on the substrate, and the first insulating layer may further include a third dummy hole formed above or adjacent to the third thin film transistor, and the number of the third dummy hole may be less than the number of the at least one first dummy hole and the number of the plurality of second dummy holes.

The first sub-pixel region, the second sub-pixel region, and the third sub-pixel region may correspond to a red sub-pixel region, a green sub-pixel region, and a blue sub-pixel region, respectively.

The first insulating layer may include an inorganic insulating material and the second insulating layer may include an organic insulating material.

At least one of the first thin film transistor and the second thin film transistor may include an active pattern on the substrate; and a first conductive layer including a gate electrode disposed on at least a portion of the active pattern, the thin film transistor array substrate may further include a second conductive layer disposed on an upper portion of the first conductive layer and including an upper electrode forming a capacitor together with the gate electrode; and a third conductive layer including a driving voltage line electrically connected to the upper electrode via a contact hole formed in the first insulating layer and applying a power voltage to the upper electrode.

The thin film transistor array substrate may further include a lower gate insulating layer disposed between the active pattern and the gate electrode; and an upper gate insulating layer disposed between the gate electrode and the second conductive layer, and the first insulating layer may be disposed on the upper gate insulating layer to cover the second conductive layer, and the second insulating layer may be disposed on the first insulating layer to cover the third conductive layer.

At least one of the at least one first dummy hole and the plurality of second dummy holes may pass through the upper gate insulating layer and the lower gate insulating layer to extend up to an upper surface of the substrate.

At least one of the at least one first dummy hole and the plurality of second dummy holes may extend up to an upper surface of the upper electrode.

The lower gate insulating layer may include a first lower gate insulating layer including a silicon oxide; and a second lower gate insulating layer disposed between the first lower gate insulating layer and the gate electrode and including a silicon nitride.

The gate electrode may include aluminum (Al).

According to one or more exemplary embodiments, an organic light-emitting display apparatus includes a substrate including a first sub-pixel region and a second sub-pixel region; a first thin film transistor and a second thin film transistor disposed in the first sub-pixel region and the second sub-pixel region on the substrate, respectively; a first insulating layer including at least one first dummy hole formed above or adjacent to the first thin film transistor, and a plurality of second dummy holes in a greater number than the number of the at least one first dummy hole, formed above or adjacent to the second thin film transistor; a second insulating layer, at least a portion of which is buried in the at least one first dummy hole and the plurality of second dummy holes, and which is formed of a material different from the first insulating layer; a first pixel electrode and a second pixel electrode disposed in the first sub-pixel region and the second sub-pixel region on the second insulating layer, respectively; a first organic emission layer and a second organic emission layer disposed on the first pixel electrode and the second pixel electrode, respectively, and emitting light of different colors; and a common electrode disposed on the first organic emission layer and the second organic emission layer.

The substrate may further include a third sub-pixel region that is adjacent to the first sub-pixel region and/or the second sub-pixel region, a third thin film transistor may be disposed in the third sub-pixel region on the substrate, and the first insulating layer may further include a third dummy hole formed above or adjacent to the third thin film transistor, and the second insulating layer may be buried in the third dummy hole, a third pixel electrode and a third organic emission layer disposed on the third pixel electrode may be disposed in the third sub-pixel region on the second insulating layer, and the number of the third dummy hole may be less than the number of the at least one first dummy hole and the number of the plurality of second dummy holes.

The first sub-pixel region, the second sub-pixel region, and the third sub-pixel region may correspond to a red sub-pixel region, a green sub-pixel region, and a blue sub-pixel region, respectively, and the first organic emission layer, the second organic emission layer, and the third organic emission layer may emit red light, green light, and blue light, respectively.

The first insulating layer may include an inorganic insulating material and the second insulating layer may include an organic insulating material.

At least one of the first thin film transistor and the second thin film transistor may include an active pattern on the substrate; a first conductive layer including a gate electrode disposed on at least a portion of the active pattern, and the organic light-emitting display apparatus may further include a second conductive layer disposed on an upper portion of the first conductive layer and including an upper electrode forming a capacitor together with the gate electrode; and a third conductive layer including a driving voltage line electrically connected to the upper electrode via a contact hole formed in the first insulating layer and applying a power voltage to the upper electrode.

The organic light-emitting display apparatus may further include a lower gate insulating layer disposed between the active pattern and the gate electrode; and an upper gate insulating layer disposed between the gate electrode and the second conductive layer, and the first insulating layer may be disposed to cover the second conductive layer on the upper gate insulating layer, and the second insulating layer may be disposed to cover the third conductive layer on the first insulating layer.

At least one of the at least one first dummy hole and the plurality of second dummy holes may pass through the upper gate insulating layer and the lower gate insulating layer to extend up to an upper surface of the substrate.

At least one of the at least one first dummy hole and the plurality of second dummy holes may extend up to an upper surface of the upper electrode.

The lower gate insulating layer may include a first lower gate insulating layer including a silicon oxide; and a second lower gate insulating layer disposed between the first lower gate insulating layer and the gate electrode and including a silicon nitride.

As described above, according to the one or more of the above exemplary embodiments, a thin film transistor array substrate and an organic light-emitting display apparatus may individually control a characteristic of thin film transistors disposed on a plurality of sub-pixels, respectively.

Also, an organic light-emitting display apparatus may be driven by using a single gamma method applying the same data voltage to a plurality of sub-pixels.

Also, quality of an image implemented by an organic light-emitting display apparatus may improve.

Of course, the scope of exemplary embodiments is not limited by these effects.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of", when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another. As used herein, the singular forms "a", "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components. It will be understood that when a layer, region, or component is referred to as being "formed on", another layer, region, or component, it can be directly or indirectly formed on the other layer, region, or component. That is, for example, intervening layers, regions, or components may be present.

Also, it will be understood that when a layer, region, or component is referred to as being "connected" to another layer, region, or component, it may be "directly connected" to the other layer, region, or component or may be "indirectly connected" to the other layer, region, or component with other layer, region, or component disposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component disposed therebetween.

Sizes of elements in the drawings may be exaggerated for convenience of explanation. In other words, since sizes and thicknesses of components in the drawings are arbitrarily illustrated for convenience of explanation, the following embodiments are not limited thereto.

Also, though an active matrix (AM) organic light-emitting display apparatus having a 7Tr-1Cap structure, including seven thin film transistors (TFTs) and one capacitor in one sub-pixel is illustrated in the accompanying drawings, exemplary embodiments are not limited thereto. Therefore, a display apparatus may have a plurality of TFTs and one or more capacitors in one sub-pixel, and a separate wiring may be further formed or an existing wiring may be omitted, so that the display apparatus may be formed to have various structures. The sub-pixels may emit light of different colors, and a plurality of sub-pixels may form one pixel. A pixel denotes a minimum unit displaying an image, and the display apparatus displays an image via a plurality of pixels.

Figure 1:
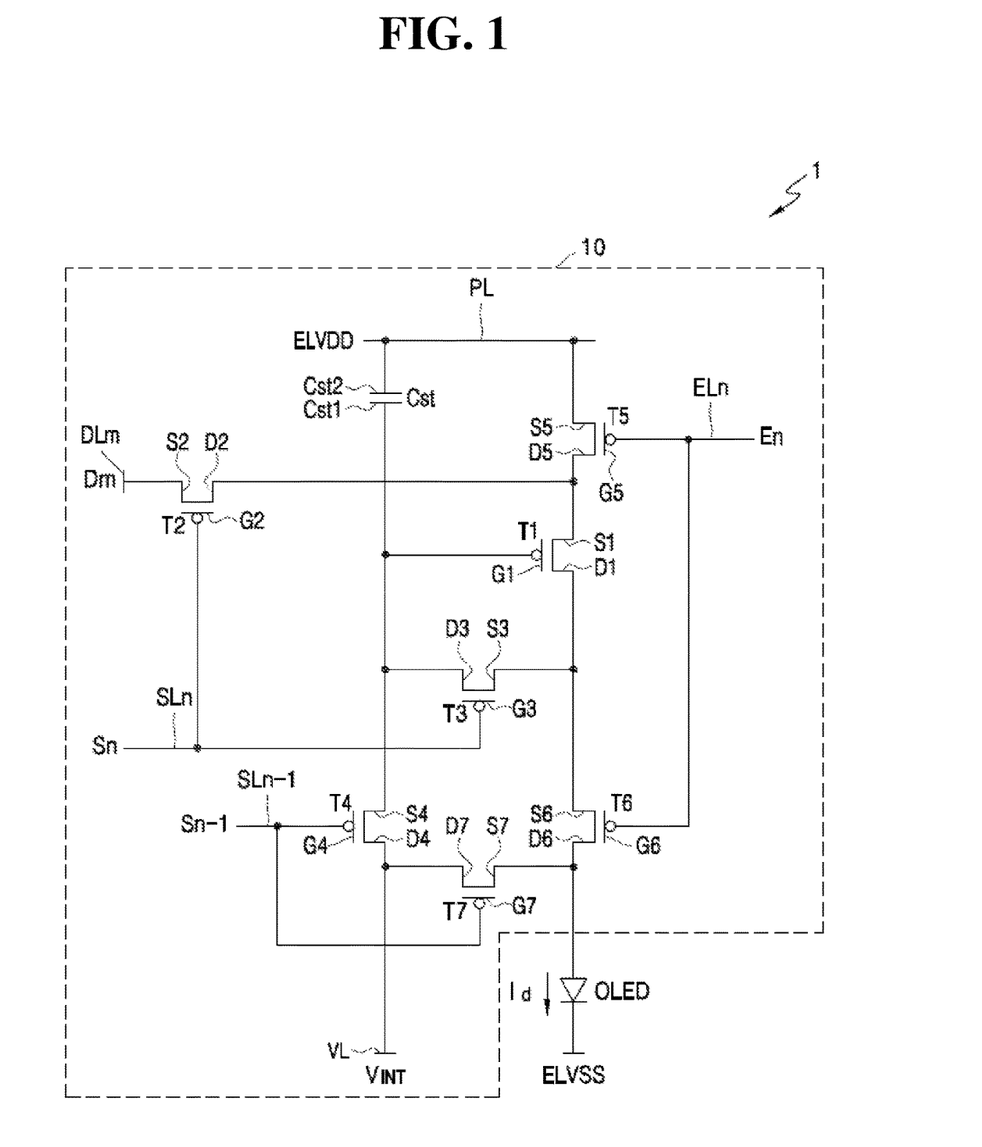
FIG. 1 is an equivalent circuit view of one sub-pixel of an organic light-emitting display apparatus according to an exemplary embodiment.

FIG. 1 is an equivalent circuit view of one sub-pixel of an organic light-emitting display apparatus 1, according to an exemplary embodiment.

The organic light-emitting display apparatus 1 includes a TFT array substrate 10 and an organic light-emitting device (OLED) disposed on the TFT array substrate 10. The organic light-emitting display apparatus 1 may include a plurality of pixels emitting light, and each pixel may include a plurality of sub-pixels. Wirings may be disposed on the TFT array substrate 10 and apply an electric signal in order to drive each sub-pixel.

The wirings may include scan lines SLn and SLn−1 for transferring scan signals Sn and Sn−1, a data line DLm for transferring a data signal Dm, and a driving voltage line PL for transferring a driving voltage ELVDD. However, exemplary embodiments are not limited thereto and may further include an initialization voltage line VL for transferring an initialization voltage VINT, and an emission control line ELn for transferring an emission control signal En as illustrated in FIG. 1. Each sub-pixel is disposed at a portion where wirings extending in a first direction cross wirings extending in a second direction that is different from the first direction.

Each sub-pixel includes an OLED that emits light and a pixel circuit that receives a signal from wirings and drives the OLED. The pixel circuit may include at least two TFTs and at least one capacitor. However, an exemplary embodiment is not limited thereto and the pixel circuit may include seven TFTs T1 to T7 and one capacitor Cst as illustrated in FIG. 1.

The TFTs may include a driving TFT T1, a data transfer TFT T2, a compensation TFT T3, a first initialization TFT T4, a first emission control TFT T5, a second emission control TFT T6, and a second initialization TFT T7.

A gate electrode G1 of the driving TFT T1 is connected with a lower electrode Cst1 of a capacitor Cst, a source electrode S1 of the driving TFT T1 is connected with the driving voltage line PL via the first emission control TFT T5, and a drain electrode D1 of the driving TFT T1 is electrically connected with a pixel electrode of the OLED via the second emission control TFT T6. The driving TFT T1 receives a data signal Dm depending on a switching operation of the data transfer TFT T2 to supply a driving current Id to the OLED.

A gate electrode G2 of the data transfer TFT T2 is connected with the scan line SLn, a source electrode S2 of the data transfer TFT T2 is connected with the data line DLm, and a drain electrode D2 of the data transfer TFT T2 is connected with the source electrode S1 of the driving TFT T1 and connected with the driving voltage line PL via the first emission control TFT T5. This data transfer TFT T2 performs a switching operation of being turned on depending on a scan signal Sn transferred via the scan line SLn to transfer a data signal Dm transferred to the data line DLm to the source electrode S1 of the driving TFT T1.

A gate electrode G3 of the compensation TFT T3 is connected to the scan line SLn, and a source electrode S3 of the compensation TFT T3 is connected with the drain electrode D1 of the driving TFT T1 and connected with the pixel electrode of the OLED via the second emission control TFT T6. A drain electrode D3 of the compensation TFT T3 is connected to all of the lower electrode Cst1 of the capacitor Cst, a source electrode S4 of a first initialization TFT T4, and the gate electrode G1 of the driving TFT T1. This compensation TFT T3 is turned on depending on a scan signal Sn transferred via the scan line SLn and connects the gate electrode G1 to the drain electrode D1 of the driving TFT T1 to diode-connect the driving TFT T1.

A gate electrode G4 of the first initialization TFT T4 is connected with a previous scan line SLn−1, and a drain electrode D4 of the first initialization TFT T4 is connected to the initialization voltage line VL. The source electrode S4 of the first initialization TFT T4 is connected to all of the lower electrode Cst1 of the capacitor Cst, the drain electrode D3 of the compensation TFT T3, and the gate electrode G1 of the driving TFT T1. The first initialization TFT T4 performs an initialization operation of being turned on depending on a previous scan signal Sn−1 transferred via the previous scan line SLn−1 and transferring the initialization voltage VINT to the gate electrode G1 of the driving TFT T1 to initialize a voltage of the gate electrode G1 of the driving TFT T1.

A gate electrode G5 of the first emission control TFT T5 is connected with an emission control line ELn. A source electrode S5 of the first emission control TFT T5 is connected with the driving voltage line PL, and a drain electrode D5 of the first emission control TFT T5 is connected with the source electrode S1 of the driving TFT T1 and the drain electrode D2 of the data transfer TFT T2. The first emission control TFT T5 is between the driving voltage line PL and the driving TFT T1. The first emission control TFT T5 is turned on by an emission control signal En transferred by the emission control line ELn to transfer the driving voltage ELVDD to the driving TFT T1.

A gate electrode G6 of the second emission control TFT T6 is connected with the emission control line ELn, and a source electrode S6 of the second emission control TFT T6 is connected with the drain electrode D1 of the driving TFT T1 and the source electrode S3 of the compensation TFT T3. A drain electrode D6 of the second emission control TFT T6 is electrically connected with the pixel electrode of the OLED. The first emission control TFT T5 and the second emission control TFT T6 are simultaneously turned on depending on an emission control signal En transferred via the emission control line ELn, so that the driving voltage ELVDD is transferred to the OLED and the driving current Id flows through the OLED.

A gate electrode G7 of the second initialization TFT T7 is connected to the previous scan line SLn−1. A source electrode S7 of the second initialization TFT T7 is connected with the pixel electrode of the OLED. A drain electrode D7 of the second initialization TFT T7 is connected with the initialization voltage line VL. The second initialization TFT T7 is turned on depending on a previous scan signal Sn−1 transferred via the previous scan line SLn−1 to initialize the pixel electrode of the OLED.

Though the exemplary embodiment has illustrated a case where the first initialization TFT T4 and the second initialization TFT T7 are connected to the previous scan line SLn−1, the exemplary embodiment is not limited thereto. In another exemplary embodiment, the first initialization TFT T4 may be connected to the previous scan line SLn−1 and driven depending on a previous scan signal Sn−1, and the second initialization TFT T7 may be connected to a separate scan line (not shown) and driven depending on a scan signal Sn+1.

An upper electrode Cst2 of the capacitor Cst is connected with the driving voltage line PL, and a common voltage ELVSS is applied to a common electrode of the OLED. Accordingly, the OLED displays an image by receiving the driving current Id from the driving TFT T1 and emitting light.

Figure 2:
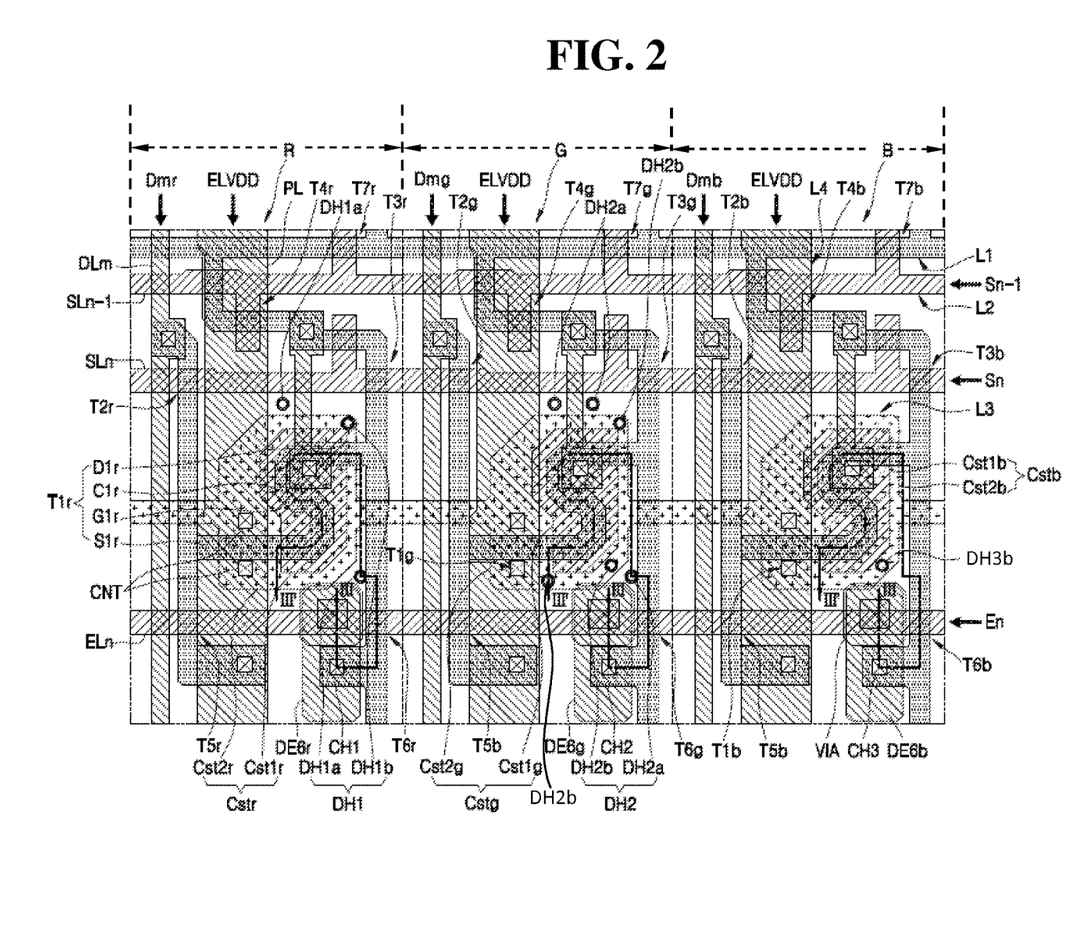
FIG. 2 is a schematic plan view illustrating one pixel included in an organic light-emitting display apparatus according to an exemplary embodiment.
Figure 3A:
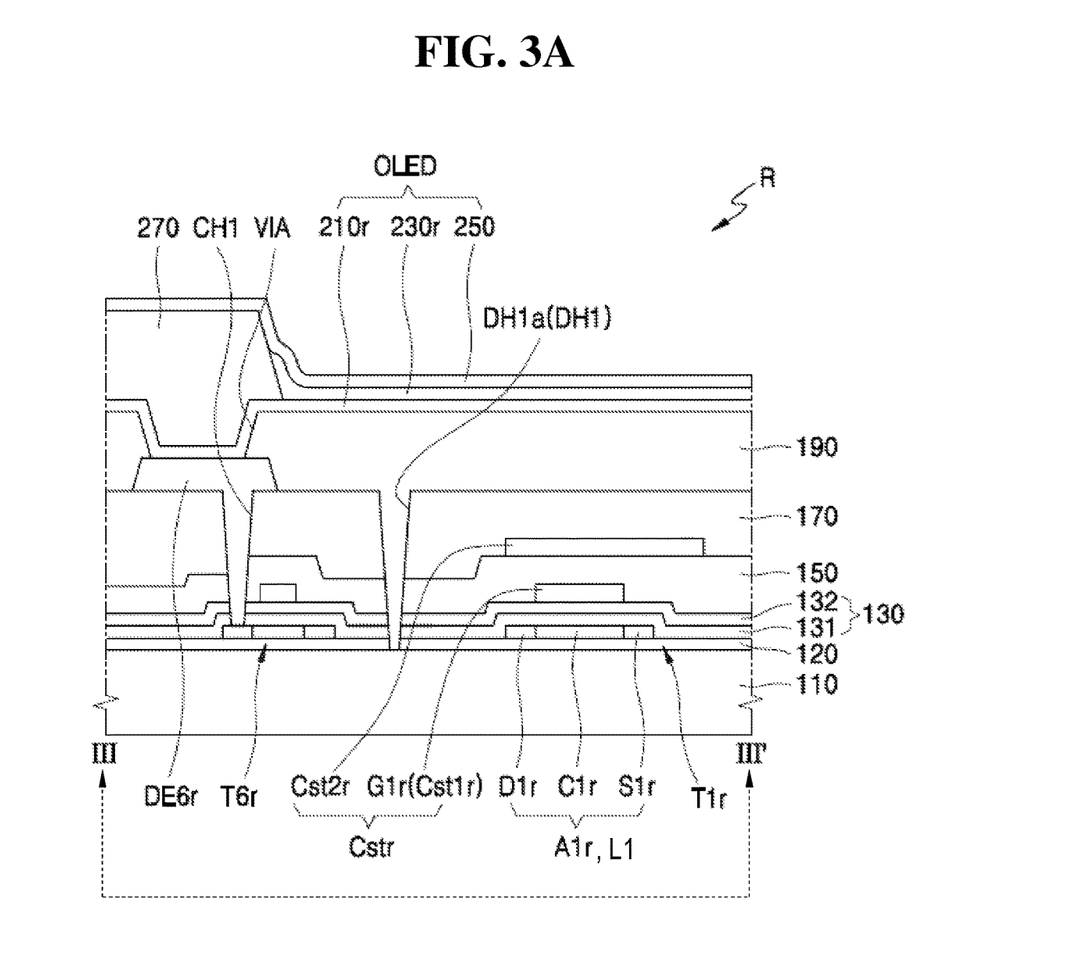
FIGS. 3A to 3C are schematic cross-sectional views taken along a line III-III' of each of a first sub-pixel region R, a second sub-pixel region G, and a third sub-pixel region B of FIG. 2.
Figure 3B:
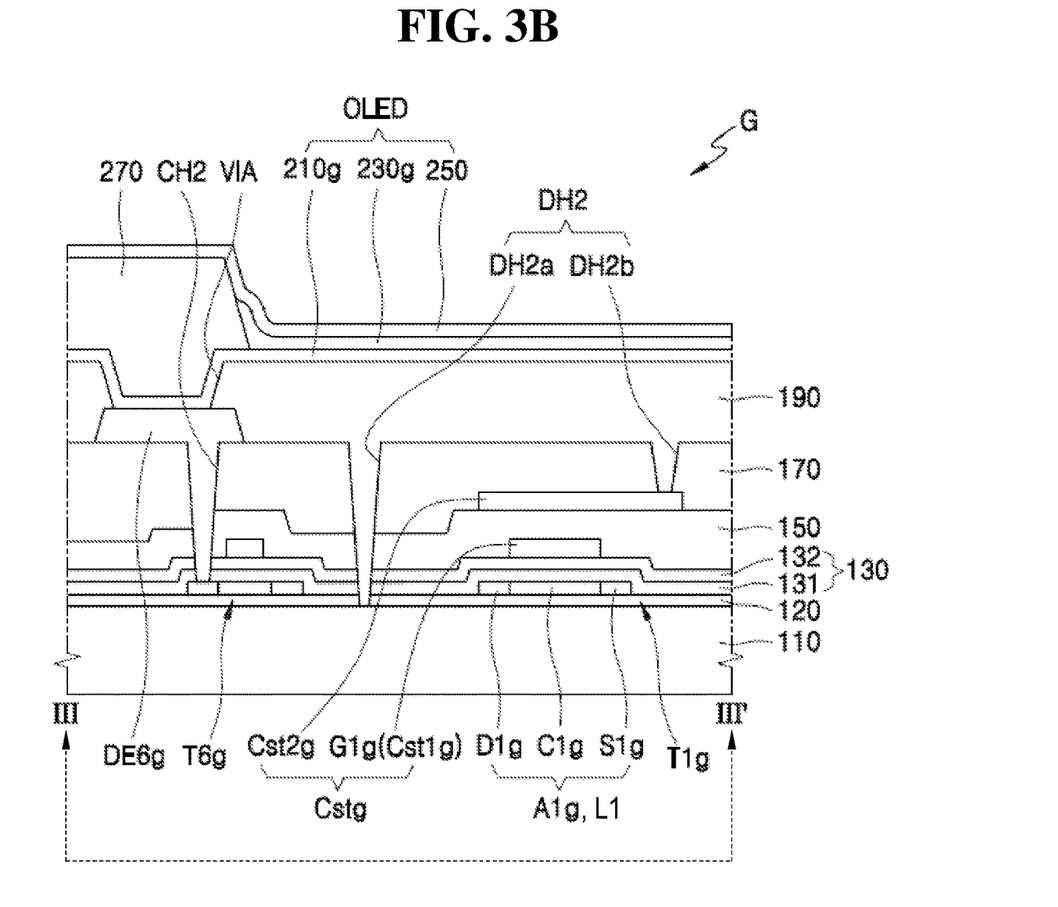
Figure 3C:
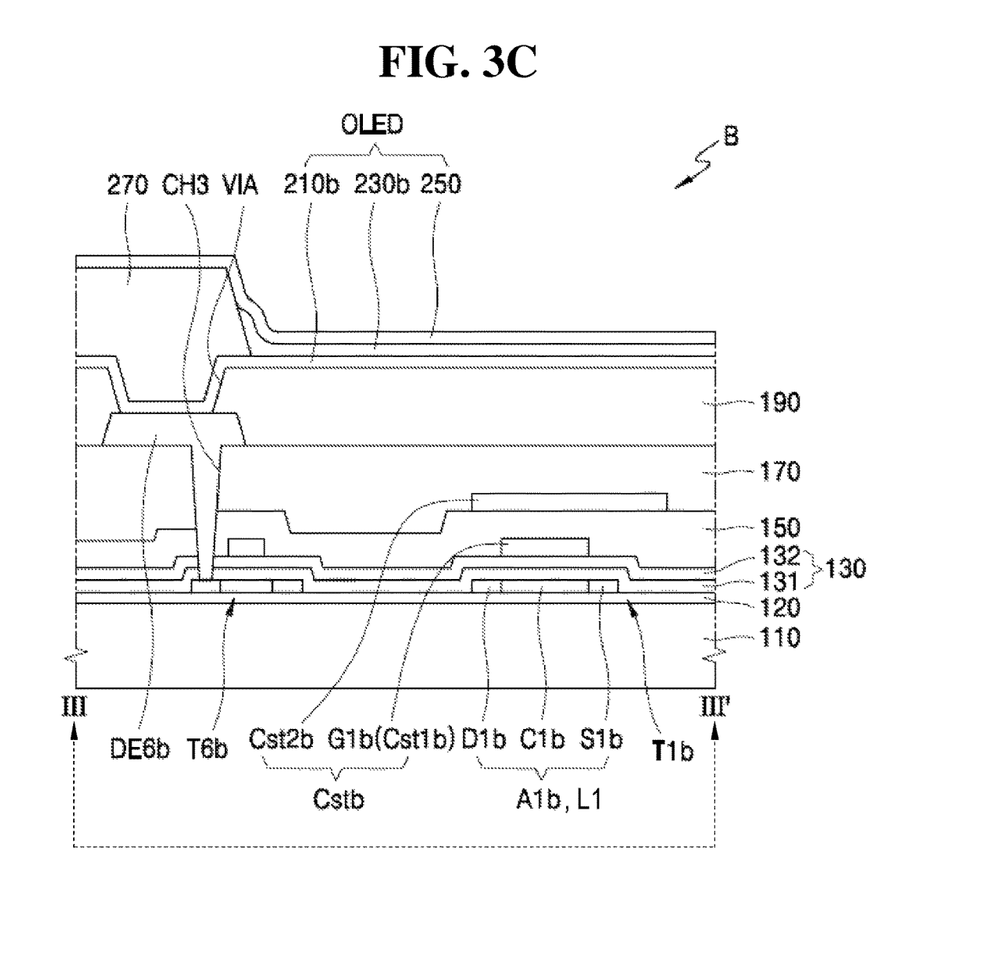

FIG. 2 is a schematic plan view illustrating one pixel of a TFT array substrate included in an organic light-emitting display apparatus according to an exemplary embodiment, and FIGS. 3A to 3C are schematic cross-sectional views taken along a line III-III' of each of a first sub-pixel region R, a second sub-pixel region G, and a third sub-pixel region B of FIG. 2.

Referring to FIGS. 2 and 3A to 3C, one pixel of the TFT array substrate 10 according to an exemplary embodiment may include the first sub-pixel region R, the second sub-pixel region G, and the third sub-pixel region B. The first to third sub-pixel regions may be a red sub-pixel region, a green sub-pixel region, and a blue sub-pixel region, respectively.

However, the exemplary embodiment is not limited thereto and the first sub-pixel region R, the second sub-pixel region G, and the third sub-pixel region B may be regions that emit light of other color combinations, capable of implementing white light by combination.

Though FIG. 2 illustrates that the first, second, and third sub-pixel regions R, G, and B have a rectangular shape, they are not limited thereto and the first, second, and third sub-pixel regions R, G, and B may have various shapes and have different areas.

In the TFT array substrate 10 according to an exemplary embodiment, a semiconductor layer L1 is disposed on a base substrate 110 and bends in various shapes. The base substrate 110 may be formed of various materials like a glass material, a metal material, or a plastic material such as polyethylene terephthalate (PET), polyethylene naphthalate (PEN), polyimide, etc., and the semiconductor layer L1 may include a semiconductor material such as polysilicon.

A buffer layer 120 may be disposed between the base substrate 110 and the semiconductor layer L1 and prevents the penetration of an impurity element into the semiconductor layer L1 from the base substrate 110 and planarizes a surface of the base substrate 110.

A first TFT T1$r$, a second TFT T1$g$, and a third TFT T1$b$ corresponding to driving transistors may be disposed in the first sub-pixel region R, the second sub-pixel region G, and the third sub-pixel region B, respectively. The first TFT T1$r$, the second TFT T1$g$, and the third TFT T1$b$ may include a first active pattern A1$r$, a second active pattern A1$g$, and a third active pattern A1$b$ which are portions of the semiconductor layer L1, respectively.

The first active pattern A1$r$, the second active pattern A1$g$, and the third active pattern A1$b$ may include channel regions C1$r$, C1$g$, C1$b$ not doped with impurities, source regions S1$r$, S1$g$, S1$b$ and drain regions D1$r$, D1$g$, D1$b$ doped with impurities and having conductivity, respectively. The channel region C1$r$, C1$g$, C1$b$ may be formed in an "S" shape to maximize a length of the channel region C1$r$, C1$g$, Crb in a limited space.

A lower gate insulating layer 130 may be disposed on the buffer layer 120 to cover the first active pattern A1$r$, the second active pattern A1$g$, and the third active pattern A1$b$. The lower gate insulating layer 130 may be formed of a thin film including layers or a single layer including an inorganic material or an organic material. According to an exemplary embodiment, the lower gate insulating layer 130 may have a multiple layer structure. That is, as illustrated in FIGS. 3A to 3C, the lower gate insulating layer 130 may include a first lower gate insulating layer 131 and a second lower gate insulating layer 132. The reason why the lower gate insulating layer 130 has a multiple layer structure is for preventing a portion of the lower gate insulating layer 130 from being etched together during a process of patterning first to third gate electrodes G1$r$, G1$g$, G1$b$.

In this case, the first lower gate insulating layer 131 may be disposed between the first to third active patterns A1$r$, A1$g$, A1$b$ and the first to third gate electrodes G1$r$, G1$g$, G1$b$, and may include a silicon oxide. The second lower gate insulating layer 132 may be disposed between the first lower gate insulating layer 131 and the first to third gate electrodes G1$r$, G1$g$, G1$b$, and may include a silicon nitride. Since a silicon nitride has a relatively stronger characteristic against an etching solution than a silicon oxide, the second lower gate insulating layer 132 including the silicon nitride is disposed on the first lower gate insulating layer 131, so that damage to the lower gate insulating layer 130 may be reduced while the first to third gate electrodes G1r, G1g, G1b are patterned.

A first conductive layer L2 may be disposed on the lower gate insulating layer 130. According to an exemplary embodiment, the first conductive layer L2 may include a previous scan line SLn−1, a scan line SLn, an emission control line ELn, the first gate electrode G1r, the second gate electrode G1g, and the third gate electrode G1b. The first gate electrode G1r, the second gate electrode G1g, and the third gate electrode G1b may serve as lower electrodes Cst1r, Cst1g, Cst1b of a first storage capacitor Cstr, a second storage capacitor Cstg, and a third storage capacitor Cstb, respectively. According to an exemplary embodiment, the first to third gate electrodes G1r, G1g, G1b may include aluminum (Al). Since Al has an excellent process margin compared to other metals, in the case of using the first to third gate electrodes G1r, G1g, G1b including Al, a TFT array substrate included in an organic light-emitting display apparatus of high resolution may be easily manufactured.

An upper gate insulating layer 150 may be disposed on the lower gate insulating layer 130 and covers the first to third gate electrodes G1r, G1g, G1b. The upper gate insulating layer 150 may be a dielectric layer disposed between the first to third gate electrodes G1r, G1g, G1b and upper electrodes Cst2r, Cst2g, Cst2b of the first storage capacitor Cstr, the second storage capacitor Cstg, and the third storage capacitor Cstb.

A second conductive layer L3 may be disposed on the upper gate insulating layer 150, and may include the upper electrodes Cst2r, Cst2g, Cst2b of the first storage capacitor Cstr, the second storage capacitor Cstg, and the third storage capacitor Cstb.

A first insulating layer 170 may be disposed on the upper gate insulating layer 150 and thus covers the second conductive layer L3. The first insulating layer 170 may be formed by a single layer or layers using a silicon oxide and/or a silicon nitride, etc. The first insulating layer 170 may include at least one first dummy hole DH1 formed above or adjacent to the first TFT T1r, and second dummy holes DH2 which are formed above or adjacent to the second TFT T1g and in a greater number than the number of the at least one first dummy hole DH1.

According to an exemplary embodiment, three first dummy holes DH1 may be formed adjacent to the first TFT T1r disposed in the first sub-pixel region R, six second dummy holes DH2 may be formed adjacent to the second TFT T1g disposed in the second sub-pixel region G, and one third dummy hole DH3 may be formed adjacent to the third TFT T1b disposed in the third sub-pixel region B. That is, different numbers of first to third dummy holes DH1, DH2, DH3 may be formed adjacent to the first, second, and third TFTs T1r, T1g, T1b disposed in the first, second, and third sub-pixel regions R, G, and B, respectively.

A characteristic of the first, second, and third TFTs T1r, T1g, T1b, for example, the slope of a current-voltage (V-I) characteristic curve may be adjusted by the first to third dummy holes DH1, DH2, DH3 formed adjacent to the first to third TFTs T1r, T1g, T1b corresponding to the driving TFT T1 of FIG. 1. That is, the characteristics of the first to third TFTs T1r, T1g, T1b may change depending on the position and the number of first to third dummy holes DH1, DH2, DH3. For example, as the number of first to third dummy holes DH1, DH2, DH3 is large, the slope of the current-voltage (V-I) characteristic curve may be reduced. That is, even when the same voltage is applied between a gate electrode and a source electrode, the intensity of a current flowing between a drain electrode and the source electrode may change depending on the number of first to third dummy holes DH1, DH2, DH3.

The first sub-pixel region R, the second sub-pixel region G, and the third sub-pixel region B may include a first organic emission layer 230r, a second organic emission layer 230g, a third organic emission layer 230b that emit light of different colors, respectively. Since materials of the first to third organic emission layers 230r, 230g, 230b are different from one another, luminance may be different even when current densities are the same.

Therefore, to allow light of different colors to be emitted in the same luminance, current densities may be adjusted by applying different data voltages to the first sub-pixel region R, the second sub-pixel region G, and the third sub-pixel region B. In this case, there may exist a problem of having to drive a display apparatus by using an independent gamma drive method of driving the first sub-pixel region R, the second sub-pixel region G, and the third sub-pixel region B by applying different data voltages to the first sub-pixel region R, the second sub-pixel region G, and the third sub-pixel region B.

However, since the organic light-emitting display apparatus 1 according to an exemplary embodiment may adjust the characteristics of the first to third TFTs T1r, T1g, T1b by adjusting the number of first to third dummy holes DH1, DH2, DH3, current densities may be allowed to differ even when the same data voltage is applied to the first, second, and third sub-pixel regions R, G, and B, and thus light of different colors emitted from the first sub-pixel region R, the second sub-pixel region G, and the third sub-pixel region B is allowed to be emitted in substantially the same luminance. That is, the organic light-emitting display apparatus 1 may be driven by a single gamma drive method, which is described later.

Referring to FIG. 2, the first to third dummy holes DH1, DH2, DH3 may include first to third dummy holes DH1b, DH2b, DH3 that overlap the second conductive layer L3 in plan view, and first and second non-overlapping dummy holes DH1a, DH2a that do not overlap any conductive layer in plan view.

Referring to FIGS. 3A to 3C, each of the non-overlapping first dummy hole DH1a and the non-overlapping second dummy hole DH2a may pass through the first insulating layer 170 and extend up to the upper gate insulating layer 150, the lower gate insulating layer 130, and the buffer layer 120 below the first insulating layer 170 until the base substrate 110 is exposed. However, the exemplary embodiment is not limited thereto and the non-overlapping first dummy hole DH1a and the non-overlapping second dummy hole DH2a may be formed in only the first insulating layer 170, or may extend up to the upper gate insulating layer 150, or the lower gate insulating layer 130 below the first insulating layer 170.

On the contrary, the overlapping first dummy hole DH1b, the overlapping second dummy hole DH2b, and the overlapping third dummy hole DH3b may overlap the upper electrodes Cst2r, Cst2g, Cst2b of the storage capacitor Cstr, Cstg, Cstb in plan view, and may be formed in the first insulating layer 170 to expose the upper electrodes Cst2r, Cst2g, Cst2b.

The first insulating layer 170 may include first to third contact holes CH1, CH2, CH3 for electrically connecting second emission control TFTs T6r, T6g, T6b with pixel electrodes 210r, 210g, 210b of the OLED in addition to the first to third dummy holes DH1, DH2, DH3.

A third conductive layer L4 may be disposed on the first insulating layer 170, and may include a data line DLm, a driving voltage line PL, drain electrodes DE6r, DE6g, DE6b of the second emission control TFTs T6r, T6g, T6b. Referring to FIG. 2, the driving voltage line PL may be electrically connected with the upper electrodes Cst2r, Cst2g, Cst2b of the capacitors Cstr, Cstg, Cstb via contact holes CNT formed in the first insulating layer 170.

A second insulating layer 190 that covers the third conductive layer L4 may be disposed on the first insulating layer 170 and buried in the first to third dummy holes DH1, DH2, DH3 included in the first insulating layer 170. According to an exemplary embodiment, the second insulating layer 190 may be formed of an organic insulating material such as an acryl-based organic material, polyimide, or benzocyclobutene (BCB), etc. The second insulating layer 190 may play a role of protecting a device such as a TFT below the second insulating layer 190 and planarizing an upper surface.

The first insulating layer 170 and the second insulating layer 190 may be formed of different materials. That is, the first insulating layer 170 including the first to third dummy holes DH1, DH2, DH3 may include an inorganic insulating material, and the second insulating layer 190 buried in the first to third dummy holes DH1, DH2, DH3 may include an organic insulating material.

The second insulating layer 190 may include a via hole VIA that exposes the drain electrodes DE6r, DE6g, DE6b of the second emission control TFTs T6r, T6g, T6b.

The second insulating layer 190 is buried in the first to third dummy holes DH1, DH2, DH3 included in the first insulating layer 170, and certain devices and wirings are not connected with each other via the first to third dummy holes DH1, DH2, DH3. On the contrary, the drain electrodes DE6r, DE6g, DE6b of the second emission control TFTs T6r, T6g, T6b are buried in the first to third contact holes CH1, CH2, CH3 included in the first insulating layer 170. Also, the drain electrodes DE6r, DE6g, DE6b and the pixel electrodes 210r, 210g, 210b of the OLED may be electrically connected via the via hole VIA. That is, the second emission control TFTs Thr, T6g, T6b and the pixel electrodes 210r, 210g, 210b of the OLED may be electrically connected via the first to third contact holes CH1, CH2, CH3 and the via hole VIA.

Though FIG. 2 illustrates that the first to third dummy holes DH1, DH2, DH3 are formed in a circular shape, the exemplary embodiment is not limited thereto and the first to third dummy holes DH1, DH2, DH3 may be formed in various shapes such as a quadrangular shape, an elliptical shape, or a polygonal shape, etc. Also, the position and the number of first to third dummy holes DH1, DH2, DH3 are not limited to the ones described with reference to FIGS. 3A to 3C. However, the number of second dummy holes DH2 should be greater than the number of the at least one first dummy hole DH1. Each of the dummy holes may have a horizontal cross-sectional shape of a circle, oval, square, rectangle, etc.

According to an exemplary embodiment, the number of third dummy holes DH3 may be less than the number of the at least one first dummy hole DH1 and the second dummy holes DH2. According to another exemplary embodiment, the third dummy hole DH3 may not exist. That is, a dummy hole may not be formed in the third sub-pixel region B.

The pixel electrodes 210r, 210g, 210b of the OLED, the first to third organic emission layers 230r, 230g, 230b, and a common electrode 250 may be disposed on the second insulating layer 190. In addition to the first to third organic emission layers 230r, 230g, 230b, at least one of a hole injection layer, a hole transport layer, an electron transport layer, and an electron injection layer may be further provided between the pixel electrodes 210r, 210g, 210b and the common electrode 250. According to an exemplary embodiment, various functional layers besides the above-described layers may be further disposed between the pixel electrodes 210r, 210g, 210b and the common electrode 250.

The pixel electrodes 210r, 210g, 210b of the OLED may be electrically connected with the second emission control TFTs T6r, T6g, T6b via the via hole VIA and the first to third contact holes CH1, CH2, CH3, and consequently, electrically connected with the first to third TFTs T1r, T1g, T1b which is the driving TFT T1 of FIG. 1 electrically connected with the second emission control TFTs T6r, T6g, T6b.

The organic emission layers 230r, 230g, 230b may be the first organic emission layer 230r, the second emission layer 230g, and the third emission layer 230b disposed in the first sub-pixel region R, the second sub-pixel region G, and the third sub-pixel region B, respectively. The first organic emission layer 230r, the second light emission layer 230g, and the third light emission layer 230b may emit red light, green light, and blue light, respectively.

The pixel electrodes 210r, 210g, 210b may be formed of a material having a high work function. In the case of a bottom emission type displaying an image in the lower direction of the base substrate 110, the pixel electrodes may be formed of a transparent conductive layer such as indium tin oxide (ITO), indium zinc oxide (IZO), zinc oxide (ZnO), indium tin zinc oxide (ITZO), etc. According to another exemplary embodiment, in the case of a top emission type displaying an image in the upper direction of the base substrate 110, the pixel electrodes may be formed of a metal reflection layer such as Ag, Mg, Al, Pt, Pd, Au, Ni, Nd, Ir, Cr, etc., and a transparent conductive layer such as indium tin oxide (ITO), indium zinc oxide (IZO), zinc oxide (ZnO), indium tin zinc oxide (ITZO), etc.

A pixel defining layer 270 defining respective sub-pixels may be disposed on the second insulating layer 190. The pixel defining layer 270 may be formed to cover the periphery of the pixel electrodes 210r, 210g, 210b to expose the upper surface of the pixel electrodes 210r, 210g, 210b.

The first to third organic emission layers 230r, 230g, 230b are disposed on the pixel electrodes 210r, 210g, 210b exposed by the pixel defining layer 270, and the common electrode 250 disposed to be common to the first, second, and third sub-pixel regions R, G, and B may be disposed on the first to third organic emission layers 230r, 230g, 230b. The common electrode 250 may be formed of a transparent electrode or a reflection type electrode.

Though not shown in the drawings, an encapsulation substrate (not shown) or an encapsulation layer (not shown) may be disposed on the common electrode 250.

Figure 4A:
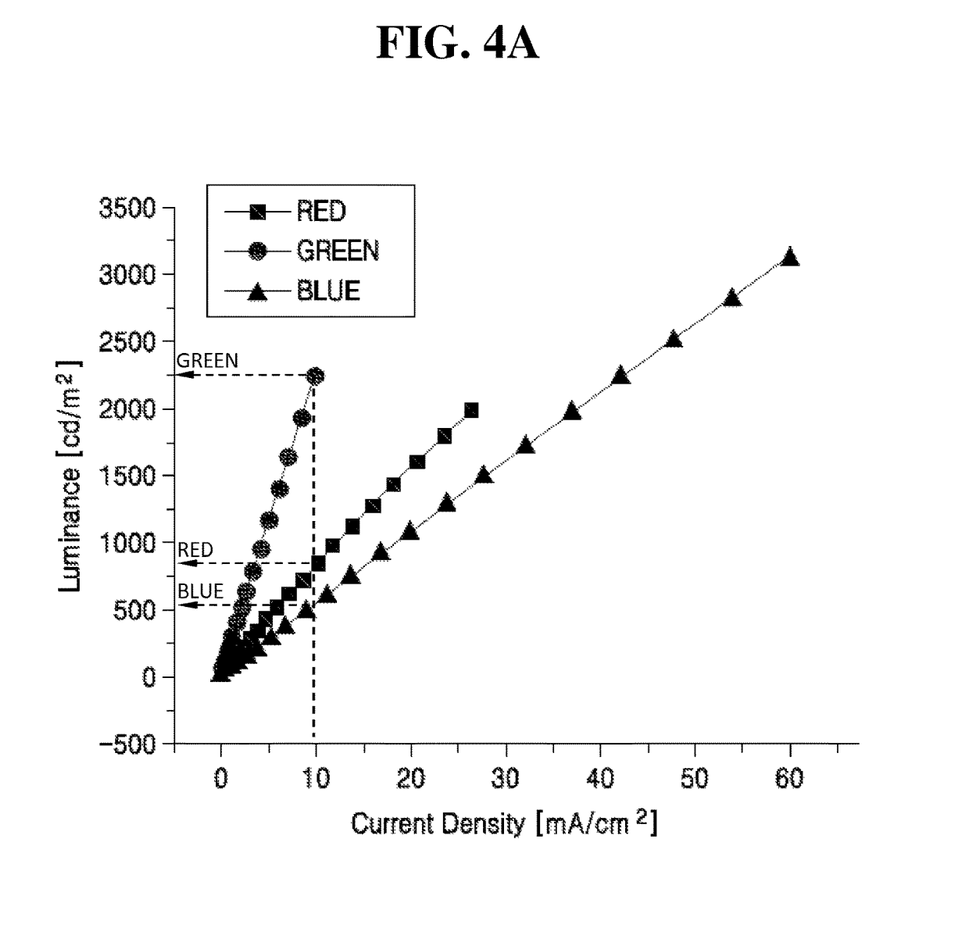
FIG. 4A is a graph illustrating luminance depending on current density of organic emission layers that emit red light, green light, and blue light.
Figure 4B:
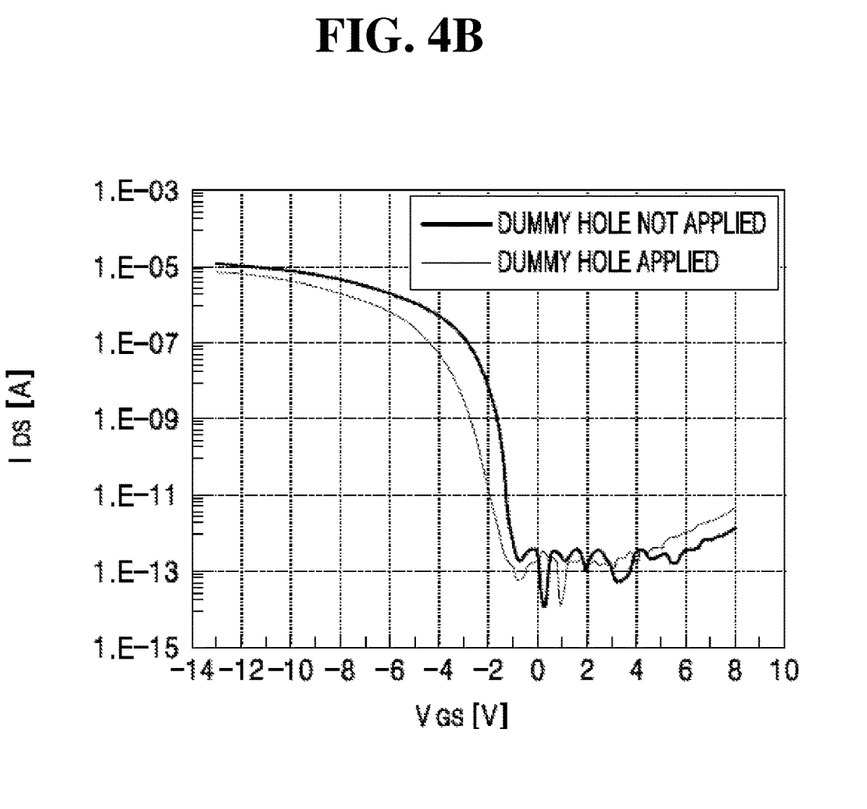
FIG. 4B is a graph illustrating a current IDS depending on a voltage VGS of a thin film transistor for a case where a dummy hole is formed and a case where a dummy hole is not formed.

Reference numerals T2r, T2g, T2b illustrated in FIG. 2 denote the data transfer TFTs T2 of FIG. 1 disposed in the first sub-pixel region R, the second sub-pixel region G, the third sub-pixel region B, respectively, reference numerals T3r, T3g, T3b denote the compensation TFTs T3 of FIG. 1 disposed in the first sub-pixel region R, the second sub-pixel region G, the third sub-pixel region B, respectively, reference numerals T4r, T4g, T4b denote the first initialization TFTs T4 of FIG. 1 disposed in the first sub-pixel region R, the second sub-pixel region G, the third sub-pixel region B, respectively, reference numerals T5r, T5g, T5b denote the first emission control TFTs T5 of FIG. 1 disposed in the first sub-pixel region R, the second sub-pixel region G, the third sub-pixel region B, respectively, and reference numerals T7r, T7g, T7b denote the second initialization TFTs T7 of FIG. 1 disposed in the first sub-pixel region R, the second sub-pixel region G, the third sub-pixel region B, respectively, FIG. 4A is a graph illustrating luminance depending on current density of organic emission layers that emit red light, green light, and blue light, and FIG. 4B is a graph illustrating a current IDS depending on a voltage VGS of a thin film transistor for a case where a dummy hole is formed and a case where a dummy hole is not formed.

FIG. 4A is a graph illustrating luminance depending on current density for each material of organic emission layers that emit red light, green light, and blue light without dummy holes, respectively.

For example, the organic emission layers that emit red light, green light, and blue light may correspond to the first organic emission layer 230r, the second emission layer 230g, the third emission layer 230b of FIGS. 3A to 3C, respectively. Organic materials that emit light have a unique chemical structure and characteristic for each material, and the first organic emission layer 230r, the second emission layer 230g, the third emission layer 230b may have different characteristics since they are different materials that emit light of different colors.

According to an exemplary embodiment, under the same current density, luminance may be greatest in the second organic emission layer 230g that emits green light, and smallest in the third organic emission layer 230b that emits blue light.

Referring to FIG. 4B, a graph illustrating a current IDS flowing between a drain electrode and a source electrode depending on a voltage VGS between a gate electrode and the source electrode of a TFT for a case where the first to third dummy holes DH1, DH2, DH3 exist adjacent to the TFT and a case where the first to third dummy holes DH1, DH2, DH3 do not exist adjacent to the TFT is provided.

The slope of a voltage-current (V-I) characteristic curve for a case where the first to third dummy holes DH1, DH2, DH3 exist may be less than the slope for a case where the first to third dummy holes DH1, DH2, DH3 do not exist. This difference of the slope may reduce or increase even more depending on the position and the number of first to third dummy holes DH1, DH2, DH3.

Referring to FIGS. 2, 4A, and 4B, to allow light-emitting red light, green light, and blue light to be emitted in the same luminance, different numbers of first to third dummy holes DH1, DH2, DH3 may be formed in the first sub-pixel region R, the second sub-pixel region G, and the third sub-pixel region B, respectively, and then the same voltage may be applied.

Since the slopes of voltage-current characteristic curves of the first TFT T1r, the second TFT T1g, and the third TFT T1b included in the first sub-pixel region R, the second sub-pixel region G, the third sub-pixel region B, respectively, are different from one another even when the same voltage is applied, different currents may flow.

Therefore, even when the slopes of current density-luminance characteristic curves of the first organic emission layer 230r, the second emission layer 230g, the third emission layer 230b included in the first sub-pixel region R, the second sub-pixel region G, the third sub-pixel region B, respectively, are different from one another, this difference may be compensated for by different numbers of first to third dummy holes DH1, DH2, DH3.

That is, even by the single gamma drive method, it is possible to make adjustment so that light of substantially the same luminance may be emitted from the first sub-pixel region R, the second sub-pixel region G, the third sub-pixel region B by using the first to third dummy holes DH1, DH2, DH3.

The red, green, and blue are exemplary and the exemplary embodiment is not limited thereto, and a combination of other colors may be possible if white light is implemented by the combination. Also, the dummy holes may be disposed in a sub-pixel region where there is disposed an organic emission layer emitting light of greatest luminance under the same current density, and may be disposed at least in a sub-pixel region where an organic emission layer emitting light of smallest luminance is disposed.

According to an exemplary embodiment, though an organic emission layer emitting light of greatest luminance is an organic emission layer emitting green light, and an organic emission layer emitting light of smallest luminance is an organic emission layer emitting blue light, the exemplary embodiment is not limited thereto.

While one or more exemplary embodiments have been described with reference to the figures, it will be understood by those of ordinary skill in the art that various changes in form and details may be made therein without departing from the spirit and scope as defined by the following claims.

What is claimed is:

1. A thin film transistor array substrate comprising:
   a substrate comprising a first sub-pixel region and a second sub-pixel region adjacent the first sub-pixel region;
   a first thin film transistor and a second thin film transistor disposed in the first sub-pixel region and the second sub-pixel region of the substrate, respectively; and
   a first insulating layer comprising
      at least one first dummy hole formed above or adjacent to the first thin film transistor, wherein a "dummy hole" is defined as a through-hole formed without being coated or filled by a metal material, and
      a plurality of second dummy holes, which are formed in a greater number than the at least one first dummy hole, formed above or adjacent to the second thin film transistor.

2. The thin film transistor array substrate of claim 1, further comprising a second insulating layer, at least a portion of which is buried in the at least one first dummy hole and the plurality of second dummy holes, and which is formed of a material different from the first insulating layer.

3. The thin film transistor array substrate of claim 1, further comprising a third sub-pixel region that is adjacent to at least one of the first sub-pixel region and the second sub-pixel region,
   a third thin film transistor disposed in the third sub-pixel region on the substrate, and the first insulating layer further comprising at least one third dummy hole formed above or adjacent to the third thin film transistor.

4. The thin film transistor array substrate of claim 3, the first sub-pixel region, the second sub-pixel region, and the third sub-pixel region corresponding to a red sub-pixel region, a green sub-pixel region, and a blue sub-pixel region, respectively.

5. The thin film transistor array substrate of claim 2, the first insulating layer comprising an inorganic insulating material and the second insulating layer comprising an organic insulating material.

6. The thin film transistor array substrate of claim 2, at least one of the first thin film transistor and the second thin film transistor comprising:
- an active pattern on the substrate; and
- a first conductive layer comprising a gate electrode disposed on at least a portion of the active pattern, the thin film transistor array substrate further comprising:
- a second conductive layer disposed on an upper portion of the first conductive layer and comprising an upper electrode forming a capacitor together with the gate electrode; and
- a third conductive layer comprising a driving voltage line electrically connected to the upper electrode via a contact hole formed in the first insulating layer and applying a power voltage to the upper electrode.

7. The thin film transistor array substrate of claim 6, further comprising:
- a lower gate insulating layer disposed between the active pattern and the gate electrode; and
- an upper gate insulating layer disposed between the gate electrode and the second conductive layer,
- the first insulating layer disposed on the upper gate insulating layer to cover the second conductive layer, and
- the second insulating layer disposed on the first insulating layer to cover the third conductive layer.

8. The thin film transistor array substrate of claim 7, at least one of the at least one first dummy hole and the plurality of second dummy holes pass through the upper gate insulating layer and the lower gate insulating layer to extend up to an upper surface of the substrate.

9. The thin film transistor array substrate of claim 7, at least one of the at least one first dummy hole and the plurality of second dummy holes extending up to an upper surface of the upper electrode.

10. The thin film transistor array substrate of claim 7, the lower gate insulating layer comprising:
- a first lower gate insulating layer comprising a silicon oxide; and
- a second lower gate insulating layer disposed between the first lower gate insulating layer and the gate electrode and comprising a silicon nitride.

11. The thin film transistor array substrate of claim 10, the gate electrode comprising aluminum (Al).

12. An organic light-emitting display apparatus comprising:
- a substrate comprising a first sub-pixel region and a second sub-pixel region adjacent the first sub-pixel region;
- a first thin film transistor and a second thin film transistor disposed in the first sub-pixel region and the second sub-pixel region on the substrate, respectively;
- a first insulating layer comprising at least one first dummy hole formed above or adjacent to the at least one first thin film transistor, and a plurality of second dummy holes formed in a greater number than the at least one first dummy hole, formed above or adjacent to the second thin film transistor;
- a second insulating layer, at least a portion of which is buried in the at least one first dummy hole and the plurality of second dummy holes, and which are formed of a material different from the first insulating layer;
- a first pixel electrode and a second pixel electrode disposed in the first sub-pixel region and the second sub-pixel region on the second insulating layer, respectively;
- a first organic emission layer and a second organic emission layer disposed on the first pixel electrode and the second pixel electrode, respectively, and emitting light of different colors; and
- a common electrode disposed on the first organic emission layer and the second organic emission layer.

13. The organic light-emitting display apparatus of claim 12, the substrate further comprising:
- a third sub-pixel region that is adjacent to at least one of the first sub-pixel region and the second sub-pixel region, the third sub-pixel region including:
- a third thin film transistor disposed on the substrate, and
- at least one third dummy hole formed in the first insulating layer, above or adjacent to the third thin film transistor, and the second insulating layer is buried in the third dummy hole, and
- a third pixel electrode and a third organic emission layer disposed on the third pixel electrode are disposed on the second insulating layer.

14. The organic light-emitting display apparatus of claim 13, the first sub-pixel region, the second sub-pixel region, and the third sub-pixel region corresponding to a red sub-pixel region, a green sub-pixel region, and a blue sub-pixel region, respectively, and
- the first organic emission layer, the second organic emission layer, and the third organic emission layer emit red light, green light, and blue light, respectively.

15. The organic light-emitting display apparatus of claim 12, the first insulating layer comprising an inorganic insulating material and the second insulating layer comprising an organic insulating material.

16. The organic light-emitting display apparatus of claim 12, at least one of the first thin film transistor and the second thin film transistor comprising:
- an active pattern on the substrate; and
- a first conductive layer comprising a gate electrode disposed on at least a portion of the active pattern, and the organic light-emitting display apparatus further comprising:
- a second conductive layer disposed on an upper portion of the first conductive layer and comprising an upper electrode forming a capacitor together with the gate electrode; and
- a third conductive layer comprising a driving voltage line electrically connected to the upper electrode via a contact hole formed in the first insulating layer and applying a power voltage to the upper electrode.

17. The organic light-emitting display apparatus of claim 16, further comprising:
- a lower gate insulating layer disposed between the active pattern and the gate electrode; and
- an upper gate insulating layer disposed between the gate electrode and the second conductive layer,
- the first insulating layer disposed to cover the second conductive layer on the upper gate insulating layer, and
- the second insulating layer disposed to cover the third conductive layer on the first insulating layer.

18. The organic light-emitting display apparatus of claim 17, at least one of the at least one first dummy hole and the plurality of second dummy holes passing through the upper gate insulating layer and the lower gate insulating layer to extend up to an upper surface of the substrate.

19. The organic light-emitting display apparatus of claim 17, at least one of the at least one first dummy hole and the plurality of second dummy holes extending up to an upper surface of the upper electrode.

20. The organic light-emitting display apparatus of claim 17, the lower gate insulating layer comprising:
   a first lower gate insulating layer comprising a silicon oxide; and
   a second lower gate insulating layer disposed between the first lower gate insulating layer and the gate electrode and comprising a silicon nitride.

* * * * *